United States Patent [19]

Tsurushima

[11] 4,031,482
[45] June 21, 1977

[54] BIAS CIRCUIT FOR FET

[75] Inventor: Katsuaki Tsurushima, Kawasaki, Japan

[73] Assignee: Sony Corporation, Tokyo, Japan

[22] Filed: Nov. 10, 1975

[21] Appl. No.: 630,331

[30] Foreign Application Priority Data

Nov. 14, 1974 Japan .............................. 49-131276
Nov. 12, 1974 Japan .............................. 49-130125

[52] U.S. Cl. .................................. 330/35; 330/13; 330/17; 330/22
[51] Int. Cl.² ......................................... H03F 3/16
[58] Field of Search ............... 307/304; 330/15, 17, 330/22, 35, 40

[56] References Cited

UNITED STATES PATENTS

| 2,858,379 | 10/1958 | Stanley | 330/22 X |
| 3,533,003 | 10/1960 | Plaszczynski | 330/35 X |
| 3,921,089 | 11/1975 | Tsurushima | 330/22 X |

OTHER PUBLICATIONS

Danilovic et al., "Voltage Stabilization of the Source Follower Operating Point", Electronic Engineering, pp. 221–223; Feb. 1969.

Primary Examiner—Rudolph V. Rolinec
Assistant Examiner—Lawrence J. Dahl
Attorney, Agent, or Firm—Lewis H. Eslinger; Alvin Sinderbrand

[57] ABSTRACT

A bias circuit particularly adapted for use with a field effect transistor whereby the drain bias current of the field effect transistor is maintained constant in the event of fluctuations in the operating voltage applied to the field effect transistor by a power supply. The bias circuit changes the gate bias voltage applied to the FET as a function of the fluctuations in the operating voltage to thereby restore the drain bias current to a constant value. A variable impedance is included in the bias circuit, the variable impedance being voltage dependent such that its impedance varies as the voltage applied thereto varies in accordance with a hyperbolic relation. The voltage applied to the variable impedance is derived from, and thus includes the fluctuations in, the operating voltage. The hyperbolic relation between the impedance and the voltage applied to the variable impedance effectively matches the relation between the pinch-off voltage $V_p$ and the amplification constant $\mu$ of the FET.

12 Claims, 12 Drawing Figures

BIAS CIRCUIT FOR FET

BACKGROUND OF THE INVENTION

This invention relates to the problem of distortion in amplified signals produced by a field effect transistor (FET) due to changes in the bias current in the FET caused by fluctuations in the operating voltage supply and, more particularly, to one solution to this problem employing the use of a transistor circuit whose impedance characteristic compensates for such bias current changes.

Recently, a field effect transistor of the type having triode-type dynamic characteristics has been developed. This type of FET offers many advantageous features, such as a very small output resistance, the avoidance of drain current saturation with an increase in drain voltage and superior voltage-current characteristic linearity. Because of these and additional features, the FET having triode-type dynamic characteristics finds ready application as an amplifier with high signal fidelity.

However, it has been found that this type of FET is particularly sensitive to fluctuations in the operating potentials supplied thereto. That is, the drain bias current will vary as the power supply voltages applied to the FET vary. As a result thereof, distortion is introduced into the amplified signal produced by the FET. One proposal for avoiding this type of distortion is disclosed in copending U.S. Application Ser. No. 508,836, filed Sept. 24, 1974, and assigned to the assignee of the instant invention.

While this earlier proposal is satisfactory for many applications, a problem may occur when the FET which is used in one circuit is not identical to the FET which is used in another, although substantially identical, circuit. Hence, if the FET parameters vary from devices to device, and in a random manner, the DC bias current to the drain may not be fully compensated when the power supply is subjected to fluctuations.

The present invention proceeds upon the recognition that in FET's having triode-type dynamic characteristics, the pinch-off voltage $V_P$ can be a random value and the amplification factor $\mu$ likewise can be a random or arbitrary value; but these physical quantities are related by $$V_P \cdot \mu = \text{constant}$$

The graphical representation of this relation is that of a hyperbola. This relationship is turned to account to compensate for changes in the DC bias current at the FET drain attributed to operating voltage fluctuations even though the particular FET which is used in one circuit has different characteristics than an FET which may be used in another circuit.

OBJECTS OF THE INVENTION

Therefore, it is an object of the present invention to provide a circuit for compensating DC bias current changes in the drain of an FET caused by power supply fluctuations.

It is another object of this invention to provide a compensating circuit which can be used with a particular type of FET regardless of the particular parameters of that FET.

A further object of this invention is to provide a compensating circuit for use with an FET having triode-type dynamic characteristics which circuit controls the bias voltage applied to the FET in a manner that matches the relationship between two of the important FET parameters.

An additional object of this invention is to provide a variable impedance circuit whose impedance varies in hyperbolic manner, and which is particularly useful in a bias circuit for an FET having triode-type dynamic characteristics.

Another object of the present invention is to provide a compensating circuit for an FET having triode-type dynamic characteristics, wherein the drain bias current of the FET varies as a function of the FET pinch-off voltage and power supply fluctuations, and wherein the compensating circuit substantially eliminates such bias current variations even though the pinch-off voltage may differ from one FET to another.

Various other objects, advantages and features will become apparent from the ensuing detailed description, and the novel features will be particularly pointed out in the appended claims.

SUMMARY OF THE INVENTION

In accordance with this invention, a compensating circuit is provided for use with an FET wherein the drain bias current of the FET is subjected to changes when the FET power supply voltage fluctuates, comprising a hyperbolically variable impedance to correspondingly vary the bias potential applied to the FET's in a manner that matches the relationship between important FET parameters, even though the parameters themselves may differ from one FET to another, thereby to compensate for drain bias current changes.

BRIEF DESCRIPTION OF THE DRAWINGS

The following detailed description, given by way of example, will best be understood in conjunction with the accompanying drawings, in which.

DETAILED DESCRIPTION OF CERTAIN REFERRED EMBODIMENTS

Figure 1:
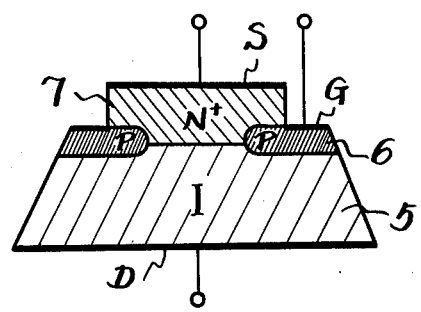
FIG. 1 is a cross-sectional view of a field effect transistor with triode-type dynamic characteristics which can be used with this invention.

Referring to the drawings, and in particular to FIG. 1, there is depicted a sectional view of one example of an FET having triode-type dynamic characteristics which may be used in a transistor amplifier. The FET is a vertical junction structure formed of an intrinsic semiconductor region 5 having low impurity concentration and high resistance, a P-type semiconductor region 6 having an annular configuration and formed on the upper portion of the intrinsic region 5, and an N-type semiconductor region 7 having high impurity concentration formed over both the annular P-type region 6 and the intrinsic region 5, as shown. The P-type region 6 may be formed by conventional selective diffusion techniques and the N-type region 7 may be formed of conventional epitaxial techniques. Of course, other methods can be used to form these regions, as desired. Respective drain D, gate G and source S electrodes are provided at the lower surface of the intrinsic region 5, an exposed portion of the P-type annular region 6 and the upper surface of the N-type region 7, respectively.

Figure 2:
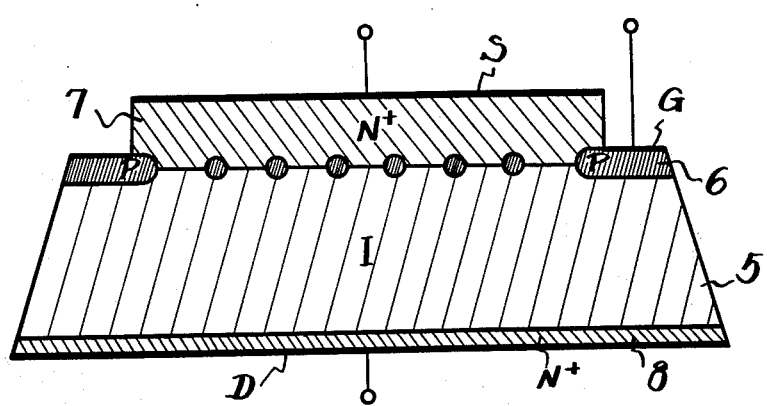
FIG. 2 is a cross-sectional view of another example of a field effect transistor with triode-type dynamic characteristics which an also be used with this invention.

The vertical junction FET depicted in FIG. 1 exhibits triode-type dynamic characteristics. A preferred embodiment of such an FET is depicted in FIG. 2 wherein like reference numerals identify corresponding elements. The FIG. 2 embodiment may be thought of as being formed by a combination of plural FET's of the type shown in FIG. 1 and closely resembles the aforedescribed FIG. 1 embodiment of the FET with the added modifications that the P-type annular region 6 is formed with a mesh-type structure therewithin, as shown. Accordingly, the high impurity concentration N-type region 7 is seen to overlie both the annular and mesh-shape P-type region 6 and the intrinsic region 5, the mesh-shape defining a boundary between the intrinsic region and the overlying high impurity concentration N-type region. Furthermore, an additional N-type semiconductor region 8 having high impurity concentration is formed on the lower surface of the intrinsic semiconductor region 5, and the drain electrode D is formed thereon. The additional N-type region serves to increase the breakdown voltage between the drain and source electrodes.

In the FET's shown in FIGS. 1 and 2, an increase in the magnitude of the gate voltage (here, of negative polarity) causes depletion layers in the vicinity of the P-type gate region 6 to grow. These depletion layers are adjacent the annular structure of the P-type region as well as the mesh-type structure therewithin. The vertical channel is formed in the regions 5 and 7 between the depletion layers. In the illustrated example, since the channel is formed in the N-type region 7, the FET is designated to be N-channel. Of course, if the region 7 is of P-type material (and the gate region 6 is of N-type material), the FET would be a P-channel device.

The equivalent internal resistance between the source and drain electrodes is a composite resistance comprised of the resistances between the source electrode and the channel within the FET, the resistance of the channel itself and the resistance between the channel and the drain electrode. In the prior art junction FET the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the foredescribed prior art junction FET, the FET shown in FIGS. 1 and 2 is characterized by a relatively small separation between the source electrode S and the vertical channel and, additionally, the channel length itself is relatively small so that the ratio of channel width to length is larger than that of the prior art lateral channel FET. Consequently, the output resistance of the vertical junction FET depicted in FIGS. 1 and 2 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

Figure 3:
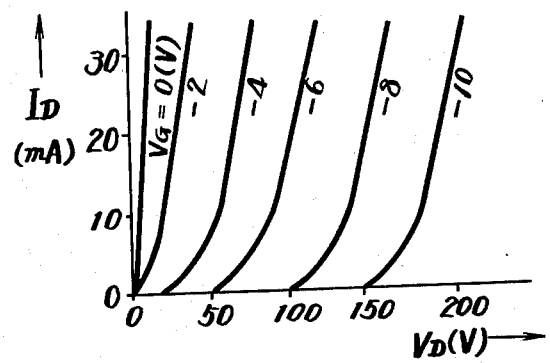
FIG. 3 is a graph showing the current-voltage characteristics at the drain electrode of the field effect transistors shown in FIGS. 1 and 2.

An illustration of the dynamic characteristics exhibited by the FET shown in FIGS. 1 and 2 is graphically represented in FIG. 3. This graphical representation depicts the relationship between the drain current $I_D$ and the drain voltage $V_D$. Each individual curve represents the current-voltage relationship for corresponding gate voltages $V_G$ wherein the gate voltage is the variable parameter. It is recognized that the characteristic curves shown in FIG. 3 are analogous to the curves which represent the dynamic characteristics of a conventional triode. Therefore, because the FET is of the type which exhibits triode-type dynamic characteristics, the output resistance is substantially constant and the FET is capable of producing a large output signal having little distortion.

Among the advantages attained by the use of the illustrated FET having triode-type characteristics is that the larger ratio of vertical channel width to channel length between the drain and source regions permits a higher drain current to flow. Another advantage is that a substantial portion of the characteristics curves depicting the relationship between drain current and voltage is linear so that odd harmonic distortion is reduced. Yet another advantage is the reduction in switching distortion which is attributed to the fact that the FET does not have the storage carriers which are included in bipolar transistors. Still another advantage is the high input impedance of the FET. As a result of such input impedance, the load presented by an input source does not cause non-linear distortion. Yet a further advantage lies in the fact that, because of its low output resistance, the illustrated FET can readily drive a load which requires a relatively high damping factor. An additional advantage is that if the illustrated FET is used in a push-pull amplifier, a complementary push-pull circuit can be formed of simple circuit construction.

The conventional lateral junction FET cannot achieve the foregoing advantages, primarily because it exhibits pentode-type dynamic characteristics and thus has a very high output resistance, on the order, for example, of several megohms. Thus, with the conventional FET, as the drain voltage increases, the drain current is driven into saturation at a relatively low value of drain voltage.

Figure 4:
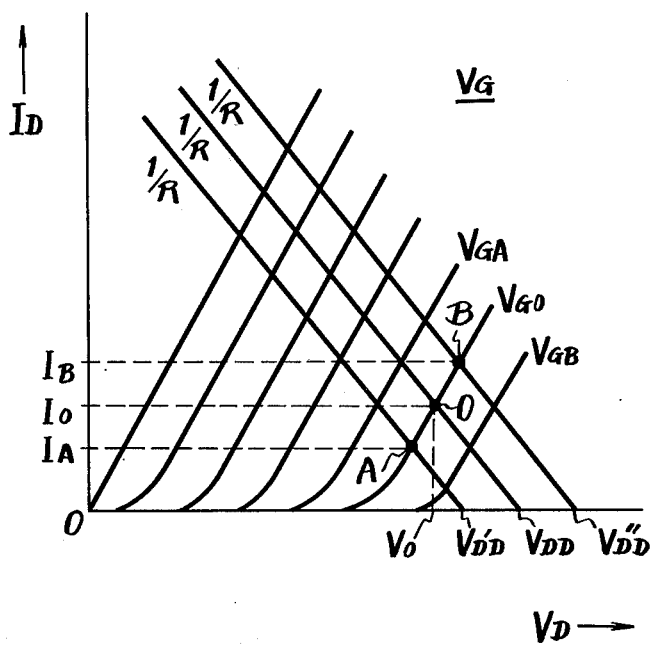

The affect of fluctuations in the operating potentials applied to the FET now will be described with reference to FIG. 4. The graphical representation of FIG. 4 depicts the triode-type dynamic characteristics of the FET. In addition, a load line is drawn on these characteristics, the load line having a slope, or inclination, equal to 1/R, where R represents the load impedance. If it is assumed that the operating potential supplied to the FET is equal to $V_{DD}$, then the load line drawn from this point is seen to intersect the current-voltage curve at the point O for the case where the FET gate voltage is equal to $V_{GO}$. This point can be considered to be a quiescent, or normal, operating point, resulting in a DC bias current equal to $I_0$ at the drain electrode.

Now, if the operating potential supplied to the FET is subjected to a fluctuation so as to be decreased to the value $V'_{DD}$, then the load line will correspondingly shift so as to intersect the abscissa at this lower point. Similarly, if the operating potential supplied to the drain electrode is increased to the higher value $V''_{DD}$, then the load line corresponding shifts, as shown. I this regard, it is apparent that a negative change in the operating potential causes the load line to intersect the current-voltage characteristic curve associated with a gate voltage equal to $V_{GO}$ at the point A. This has the effect of reducing the drain bias current from its quiescent value $I_0$ to a lower value $I_A$. Similarly, in response to a positive change in the operating potential supplied to the FET drain electrode, the intersection of the load line with the $V_{GO}$ current-voltage curve now occurs at the point B, resulting in an increased drain bias current $I_B$.

This variation in the drain bias current caused by fluctuations in operating potential supplied to the FET drain electrode has the deleterious affect of producing distortions in the output of the audio amplifier. This disadvantage is accentuated for the amplifier configuration wherein N-channel and P-channel FET's having triode-type dynamic characteristics are used as a complementary push-pull audio amplifier, or in a class-AB amplifier. This can be readily appreciated when it is recognized that, in such an amplifier configuration, the N-channel and P-channel FET's are selected to have current-voltage characteristics curves with respect to the drain electrode which have matched cut-off characteristics.

Figure 5:
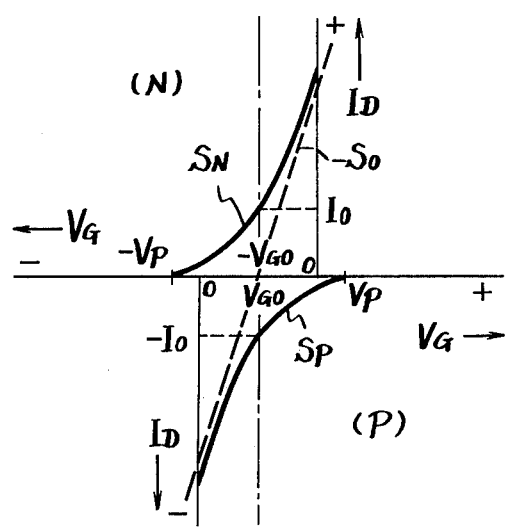
FIGS. 4 and 5 are graphs which are useful in explaining the DC bias current changes for a field effect transistor with triode-type dynamic characteristics.

The operation derived from matched complementary FET's having triode-type dynamic characteristics is graphically represented in FIG. 5. In this graphical depiction, the full line SN in the upper half of the graph represents the relationship between the drain current and the gate voltage of the N-channel FET. The full line SP in the lower half of the graph represents the relationship between the drain current and the gate voltage of the P-channel FET. If the gate voltages applied to the respective FET's are equal to $-V_{GO}$ and $+V_{GO}$, then a composite characteristic curve for the complementary FET's will effectively be as indicated by the broken line $S_O$. However, if the drain bias currents of these FET's are increased, for example, from $I_0$ to $I_B$ as a result of operating potential fluctuations, then a step is formed in the composite characteristic curve $S_O$ at zero drain current. This step results in the introduction of crossover distortion in the push-pull amplifier output.

Accordingly, in the push-pull amplifier as well as in most other types of amplifier in which the FET having triode-type dynamic characteristics is used as the amplifying element, the DC bias current at the drain should be maintained constant even if the operating voltage of the power supply is subjected to fluctuations.

In addition to being influenced by power supply voltage fluctuations, the drain bias current also is related to the pinch-off voltage of the FET. Since the pinch-off voltage can vary from FET to FET even though they have matched cut-off characteristics and exhibit triode-type dynamic characteristics, it would appear that the drain bias current would have to be adjusted for the particular FET which is used.

Figure 6:
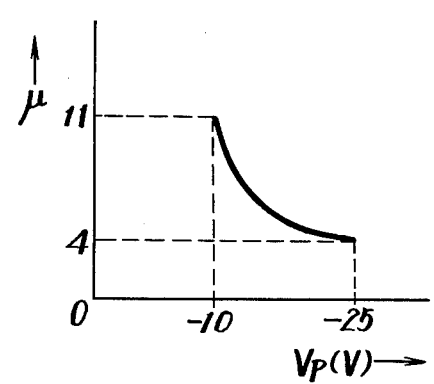
FIG. 6 is a graph showing the relationship between the pinch-off voltage and voltage amplification constant of the field effect transistor.

The present invention proceeds upon the recognition of the relationship between the pinch-off voltage $V_P$ and the voltage amplification constant $\mu$. More particularly, the voltage amplification constant $\mu$ of the FET which has triode-type dynamic characteristics is inversely related to the FET pinch-off voltage $V_P$ as shown in FIG. 6. This, of course, means that the voltage amplification constant $\mu$ also differs from one FET to another. However, the relation $V_P \cdot \mu =$ constant permits the values of the bias circuit components to be ascertained in accordance with the parameters $V_P$ and $\mu$ of the FET which is used, and this relation enables the same bias circuit to be used with different FET's without requiring many readjustments.

According to the present invention, in a transistor amplifier circuit using, as an amplifying element, an FET with triode-type dynamic characteristics, which FET is biased so that a signal voltage applied thereto does not cause pinch-off, a fixed bias circuit is provided for supplying a variable bias voltage which maintains the FET DC bias current substantially constant even though the FET operating voltage may fluctuate. The fixed bias circuit is formed of a constant current circuit which includes a two-terminal impedance circuit having a variable impedance. The voltage-impedance characteristic of the circuit can be varied as a function of the pinch-off voltage of the FET to correspondingly vary the FET bias current, and thereby a substantially constant bias current is obtained even though the power supply voltage for the FET may fluctuate.

An embodiment of the amplifier circuit and bias current compensating circuit according to the present invention will now be described with reference to FIG. 7. A class-AB complementary push-pull amplifier circuit 13 is comprised of vertical junction FET's having triod-type dynamic characteristics. As shown, N- and P-channel type vertical junction FET's $Q_{3a}$ and $Q_{3b}$ are interconnected such that the source electrode of FET $Q_{3a}$ is connected to an output terminal $t_3$ and its drain electrode is connected to a source of operating voltage $+B_1$, and the source electrode of FET$_{3b}$ is connected to the output terminal $t_3$ and its drain electrode is connected to a source of operating voltage $-B_1$. A load 21, such as a loudspeaker system, is connected between the output terminal $t_3$ and a reference potential, such as ground.

The FET's $Q_{3a}$ and $Q_{3b}$ are supplied with bias voltages from a fixed bias circuit 12. A signal, such as an audio signal, is superimposed onto the bias voltages by a driving stage comprised of a class-A amplifier 11 having an input terminal $t_1$ and an output terminal $t_2$.

The bias circuit 12 is formed of symmetrical bias networks 12a, which supply a bias to the FET $Q_{3b}$, and 12b which supply a bias to the FET $Q_{3a}$. These bias networks 12a and 12b form constant current circuits and, additionally, are adapted to detect changes in the operating voltage applied to the FET's.

Referring first to the bias network 12a, it includes a PNP-type biopolar transistor $Q_{1a}$ having an emitter electrode connected through a resistor 17a to a source of operating voltage $+B_2$ and a collector electrode connected through a resistor 18a to the driving stage output terminal $t_2$. The base electrode of the transistor $Q_{1a}$ is connected through a two-terminal impedance circuit K and a series resistor 16 to the base electrode of a transistor $Q_{1b}$ included in the bias network $12b$. The base electrode of transistor $Q_{1a}$ is also connected to the source $+B_2$ through series-connected diodes $D_{2a}$, $D_{1A}$ and a resistor $15a$. The diodes are poled to apply a constant voltage to the transistor base electrode, resulting in a constant current through the collector-emitter circuit thereof. The bias circuit $12a$ also includes an NPN-type transistor $Q_{2a}$ which is adapted to provide impedance conversion, and is connected to the collector electrode of transistor $Q_{1a}$ in emitter-follower configuration. Accordingly, the collector electrode of transistor $Q_{2a}$ is connected through a resistor $19a$ to source $+B_2$ and its emitter electrode is connected to the gate electrode of the FET $Q_{3b}$. Additionally, the emitter electrode of the transistor $Q_{2a}$ is connected through a resistor $20$ to the emitter electrode of a transistor $Q_{2b}$ of the bias network $12b$ for a purpose soon to become apparent.

The bias network $12b$ is symmetrical to the just-described bias network $12a$ and includes the NPN-type transistor $Q_{1b}$ having an emitter electrode connected through a resistor $17b$ to a source of operating voltage $-B_2$ and a collector electrode connected through a resistor $18b$ to the driving stage output terminal $t_2$. The base electrode of the transistor $Q_{1b}$ is connected to the source $-B_2$ through series-connected diodes $D_{1b}$, $D_{2b}$ and a resistor $15b$. The diodes serve to apply a constant voltage to the transistor base electrode, resulting in a constant collector-emitter current. The PNP-type transistor $Q_{2b}$ is adapted to provide impedance conversion and is connected to the collector electrode of the transistor $Q_{1b}$ in emitter-follower configuration. Hence, the collector electrode of the transistor $Q_{2b}$ is connected to the source $-B_2$ through a resistor $19b$ and at its emitter electrode is connected to the gate electrode of the FET $Q_{3a}$. The sources $+B_2$, $-B_2$, $+B$ and $-B_1$ are not necessarily stabilized voltage sources, but in a preferred embodiment, the source of operating voltage $+B_3$ and $-B_3$ which are connected to the amplifier $11$ are stabilized.

The impedance of the two-terminal impedance circuit K is adapted to vary in response to a voltage supplied thereto in such a manner whereby its impedance decreases to asymptotically approach a constant value as the voltage applied thereto increases, and its impedance increases to asymptotically approach an infinite value as the voltage applied thereto decreases. As shown in FIGS. 7 and 8, the two-terminal circuit K includes a transistor Q (in the illustrated example, an NPN-type bipolar transistor) which functions as a variable impedance element. The collector electrode of this transistor is connected to a first terminal $T_1$, and a base biasing circut formed of resistors 1 and 2 extends between the first terminal and a second terminal $T_2$. The base electrode is connected to the biasing circuit at the junction defined by the resistors 1 and 2. The emitter electrode of the transistor Q is connected through a resistor 3 to the second terminal $T_2$.

Since the bias networks $12a$ and $12b$ are symmetrical with respect to the driving stage output terminal $t_2$, and since the voltages at the collector electrodes of the transistors $Q_{1a}$ and $Q_{1b}$ will fluctuate in the same phase, the output terminal $t_2$ can be considered to be grounded when analyzing the DC bias voltage produced by these networks. The bias network $12a$, shown in simplified form in FIG. 9 (the transistor $Q_{2a}$ is omitted) will be analyzed. If it is assumed that the resistance values of resistors $17a$, $18a$ and $15a$ are $r_1$, $r_2$ and $r_3$; and if the equivalent resistance through the impedance circuit K from the base electrode of the transistor $Q_{1a}$ to ground is $r_4$, i.e., one-half of the resistance value of the series connection of the two-terminal circuit K and the resistor 16, and if the voltage of the source $+B_2$ is $E_{GG}$, the base-emitter voltage of the transistor $Q_{1a}$ is $V_{BE}$, the forward voltage of the diode $D_{1a}$ is $V_d$, and $r_2/r_1$ is $k$, then the DC bias voltage $E_O$ obtained at the collector electrode of transistor $Q_{1a}$ can be expressed as follows:

$$E_O = \left\{ V_d + \frac{r_3}{r_3 + r_4}(E_{GG} - 2V_d) - V_{BE} \right\} k \quad (1)$$

It is appreciated, from the graphical representations of FIG. 4, that as the operating voltage ($E_{GG}$ in this case) increases, the drain bias current increases and, conversely, as the operating voltage decreases, the drain bias current decreases. Therefore, to stabilize the drain bias current even though the operating voltage fluctuates, the gate voltage of the FET should be changed in the same direction as the operating voltage fluctuations. That is, if the operating voltage increases, then the gate voltage ($E_O$ in this case) should be increased from $V_{GO}$ to $V_{GB}$, as shown in FIG. 4. If the operating voltage decreases, then the gate voltage should be decreased from $V_{GO}$ to $V_{GA}$.

The following equations analyze the relationship between the change in the operating voltage ($E_{GG}$) and the change in the gate voltage ($E_O$) and establish the values of various circuit components which will effect the necessary increases and decreases in gate voltage in response to operating voltage fluctuations to hold the drain bias current at a constant value, for example $I_O$.

If equation (1) is partially differentiated with respect to $E_{GG}$ to determine the effects of source fluctuations on the DC output voltage, the result is:

$$\frac{\delta E_O}{\delta E_{GG}} = k \frac{r_3}{r_3 + r_4} \quad (2)$$

If the following is assumed, $$\frac{\delta E_O}{\delta E_{GG}} = \frac{1}{\mu} \quad (3)$$

where $\mu$ is the amplification constant of the FET $Q_{3b}$, then the components of the bias circuit can be selected such that variations of drain current $I_d$ of this FET can be suppressed.

From equations (2) and (3), the following is obtained:

$$\mu \cdot k \frac{r_3}{r_3 + r_4} = 1 \quad (4)$$

Let it be assumed that the operating voltages produced by the sources $+B_1$, $-B_1$, $+B_2$ and $-B_2$ all are obtained from a common power supply so that voltage fluctuations of the same magnitude appear simultaneously in al of these sources. If the values of $k$, $r_3$ and $r_4$ are selected to satisfy the equations (1) and (4), the DC drain bias current $I_{do}$ of the transistor $Q_{3b}$ can be made constant regardless of fluctuations in the voltage produced by the source $-B_1$. By way of numerical example, if it is assumed that $E_O = 21$ volts; $E_{GG}$ 74 volts;

$V_d = 1.3$ volts; $V_{BE} = 0.6$ volts and the FET has an amplification constant $\mu = 8.1$, then $k = 15.6\Omega$ and $r_4/r_3 = 125$. These values obtain $r_1 = 820\phi$, $r_3 = 270\Omega$, $r_2 = 13K\Omega$ and $r_4 = 34K\Omega$, respectively.

The foregoing relation and equations are equally applicable to the bias network 12*b*, provided the FET's $Q_{3a}$ and $Q_{3b}$ have the same characteristics. In this manner, the circuit components of the bias networks 12*a* and 12*b* can be selected.

Figure 9:
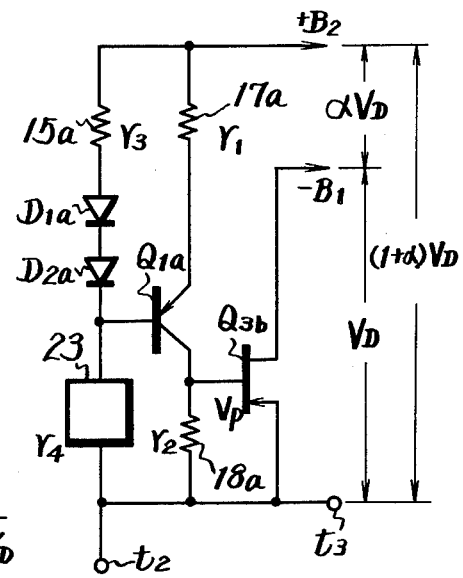
FIGS. 8 to 10 are circuit diagrams showing portions of the circuit shown in FIG. 7.
Figure 7:
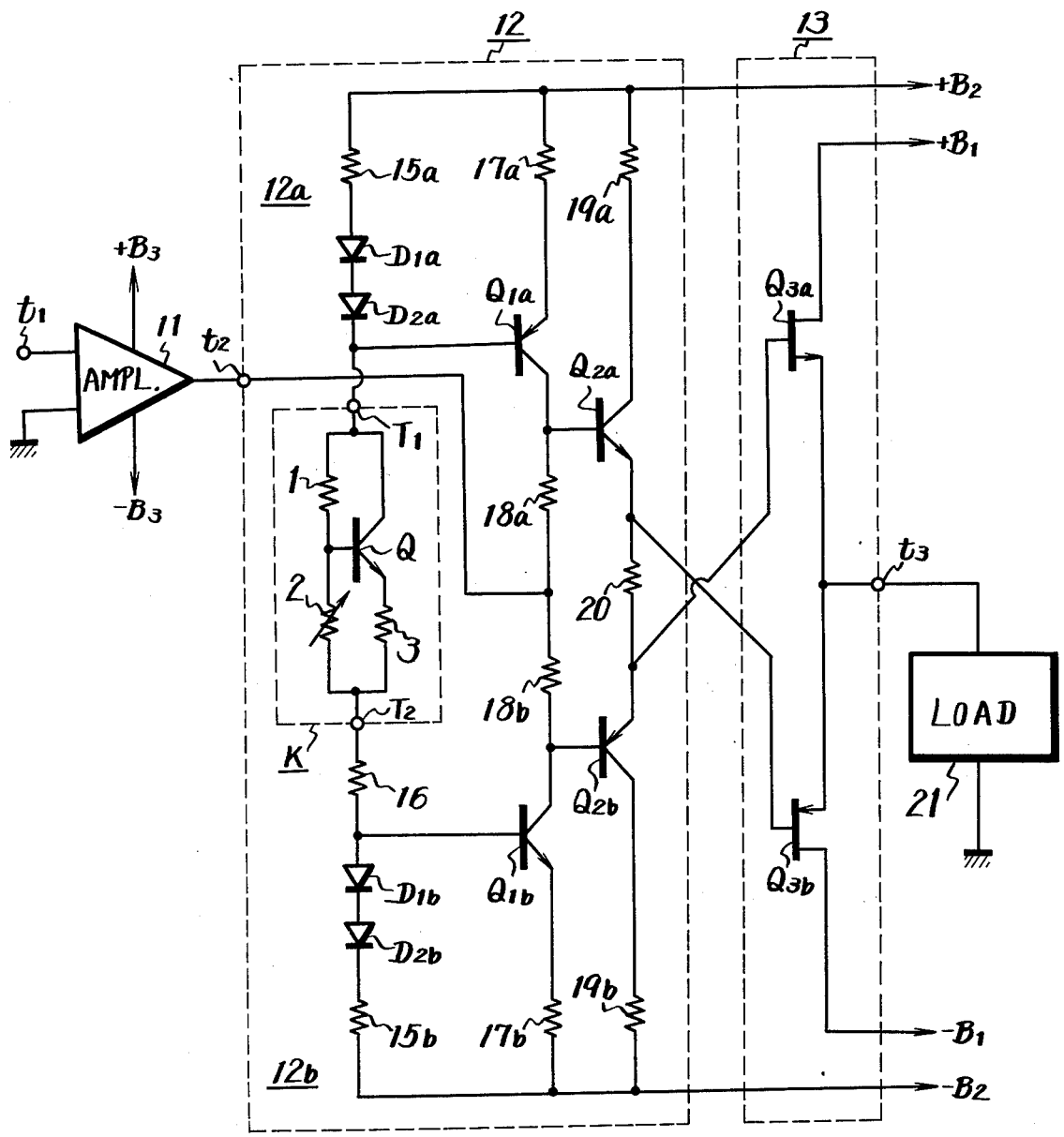
FIG. 7 is a schematic circuit diagram showing one example of the transistor circuit according to the present invention.
Figure 8:
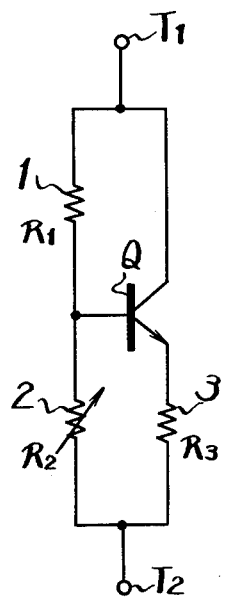

With the circuit shown in FIGS. 7 and 9, it is recognized that, when the power supply which energizes the voltage sources is initially turned on, a finite time is necessary for full voltage to be applied. Hence, the gate bias voltages for the FET's initially are zero and then increase in a positive and negative sense, respectively, to the values determined above. Accordingly, with zero gate bias voltage, the FET's are conducting, but the drain bias current can be controlled so as not to exceed a determined initial current by providing a time constant circuit (not shown) between the source $+B_2$ and $+B_1$ and between the source $-B_2$ and $-B_1$. This has the advantage of enabling the gate bias voltage to increase more rapidly than the FET operating voltage which also limits the drain bias current during turn-on. If the bias circuit 12 is free of time constant circuits, the information signal to be amplified, such as an audio signal, is not subjected to deterioration or phase distortion attributed to such a time constant circuit.

As described above, the fixed bias circuit 12 is provided with constant current circuits which include the bipolar transistor $Q_{1a}$ and $Q_{1b}$. Consequently, if the voltage produce by the source $+B_2$ and/or $-B_2$ is subjected to fluctuations, the constant current produced by the bias circuit also may vary. Thus, the constant voltage produced at the collector electrode of each of transistors $Q_{1a}$ and $Q_{1b}$, and applied through transistors $Q_{2a}$ and $Q_{2b}$, respectively, to the gate electrodes of the FET's $Q_{3b}$ and $Q_{3a}$, respectively, may vary. When the operating voltage produced by the sources $+B_1$ and $-B_1$ and supplied to the FET's $Q_{3a}$ and $Q_{3b}$ is changed, the voltage produced by the sources $+B_2$ and $-B_2$ is correspondingly changed because, as mentioned above, all of the sources are supplied from a common power supply. This causes the constant current to change, whereby the gate bias voltage is varied. This change in the gate bias voltage compensates the change in the DC drain bias current to the FET's $Q_{3a}$ and $Q_{3b}$ caused by the change in the source voltage at the sources $+B_1$ and $-B_1$ so that the drain bias current is held constant.

Since the transistors $Q_{2a}$ and $Q_{2b}$ in the circuit of FIG. 7 function as impedance converters, the foregoing analysis is applicable if these transistors are omitted, as shown in the simplification of FIG. 9. In these circuits, each of the FET's can be formed of two or more FET components connected in parallel, or the like.

In the circuit of FIG. 9, let is be assumed that the drain-source voltage of the FET $Q_{3b}$ is equal to $V_D$ (and also the voltage produced by the source $-B_1$), the voltage between the sources $+B_2$ and $-B_1$ is $\alpha V_D$, the base-emitter voltage of the transistor $Q_{1a}$ is $V_{BE}$ and the forward voltage drop of the diodes $D_{1a}$ and $D_{2a}$ is $V_d$ which is equal to $V_{BE}$, then the bias voltage applied across the gate and source electrodes of the FET $Q_{3b}$ (which is here assumed to be equal to the pinch-off voltage $V_P$) is expressed as follows:

$$\left[\left\{(1+\alpha)V_D - 2V_d\right\}\frac{r_3}{r_3+r_4} + 2V_d - V_{BE}\right]\frac{r_2}{r_1} = V_P \quad (5)$$

$$\frac{r_3}{r_3+r_4} = M \quad (6)$$

and $$r_2/r_1 = k \quad (7)$$

equation (5) can be rewritten as follows:

$$[\{(1+\alpha)V_D - 2V_{BE}\}M + V_d]k = V_P \quad (8)$$

where $V_d = V_{BE}$ and $M$ and $k$ are constant.

Equation (8) can be rearranged as follows:

$$M \cdot k(1+\alpha)V_D + k(1-2M)V_d = V_P \quad (9)$$

If the change in the drain voltage $V_D$ due to a different pinch-off voltage is considered by partially differentiating equation (9) with respect to $V_P$, the following is obtained:

$$M \cdot k(1+\alpha)\frac{\delta V_D}{\delta V_P} = 1 \quad (10)$$

The assumption of equation (3) is applicable so that $$\frac{\delta V_D}{\delta V_P} \approx \frac{\delta V_D}{\delta V_{GS}} = \mu \quad (11)$$

where $\mu$ is the voltage amplification constant of the FET. Accordingly, equation (10) can be rewritten as follows:

$$\mu \cdot M \cdot k(1+\alpha) = 1 \quad (12)$$

If equation (12) is substituted into the equation (9), the latter equation can be expressed as follows:

$$\frac{1}{\mu}V_D + \frac{(1-2M)}{\mu \cdot M(1+\alpha)}V_d = V_P \quad (13)$$

Equation (13) cab be arranged as $$V_D + \frac{(1-2M)}{M(1+\alpha)}V_d = \mu \cdot V_P \quad (14)$$

If it is assumed that $r_4 >> r_3$ so that $M$ is small, then $(1=2M)$ is approximately 1. It is recalled that $\mu \cdot V_P = $ constant even though these parameters can differ from one FET to another, and this relationship is graphically shown in FIG. 6. Now, if $1/M = N$, equation (14) can be expressed as follows:

$$\frac{1}{M} = N = \frac{1+\alpha}{V_d}(\text{constant} - V_D) \quad (15)$$

Based upon the equations (12) and (15), the following is obtained.

$$k = \frac{\text{constant} - V_D}{\mu \cdot V_d} \quad (16)$$

For equation (16) to be satisfied, it is appreciated that when a particular FET having triode-type dynamic characteristics is used, which FET has a different $\mu$ than other FET's, then $k$, or $r_2/r_1$, must be changed because of this different $\mu$. In other words, the respective resistors 18a and 18b in FIG. 7 should be variable in ganged relation so as to account for the different $\mu$. However, if the resistance values of the resistors 18a and 18b are changed, the circuit impedance presented to the signal supplied from the driving stage 11 is changed; and this impedance change is not preferred.

Therefore, for the case where $\mu$ is different, but with the restriction that $k$ in equation (16) is kept constant, it is necessary for the FET gate bias voltage to be controlled by $r_4$. Stated otherwise, the impedance $r_4$ should be variable as a function of the FET drain voltage as:

$$r_4 = f(V_D) \tag{17}$$

Proper gate bias control is attained if $r_4$ is varied inversely with respect to $V_D$. Moreover, this relationship should be a hyperbolic function to maintain the relation of $V_P \cdot \mu =$ constant and, accordingly, to satisfy the equation (15). The two-terminal impedance circuit K satisfies these conditions.

Figure 10:
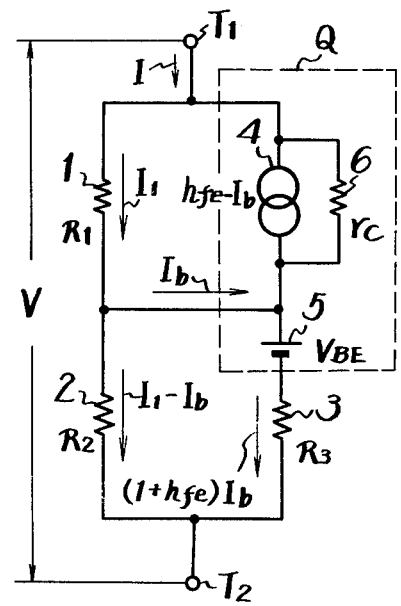

The analysis of the two-terminal impedance circuit K now will be described with reference to the equivalent circuit thereof shown in FIG. 10. In FIG. 10, the transistor Q is shown as an equivalent circuit formed of a voltage source 5 having a voltage $V_{BE}$, a current source 4 for producing a current $h_{fe} \cdot I_b$ and a resistor 6 having a resistance $r_c$, where $V_{BE}$ represents the base-emitter voltage of the transistor Q (for example, 0.6 volt); $h_{fe}$ is the current amplification constant when the transistor is in common emitter configuration, $I_b$ is the transistor base current, and $r_c$ is the transistor collector resistance. If it is assumed that the voltage applied across the first and second terminals $T_1$ and $T_2$ is a DC voltage V, the current flowing between the terminals $T_1$ and $T_2$ caused by the voltage V is I, and the current flowing through the first resistor 1 caused by the voltage V is $I_1$, then the current flowing through the second resistor 2 is $I_1 - I_b$ and the current flowing through the third resistor 3 is $(1 + h_{fe})I_b$.

When the transistor Q in the equivalent circuit of FIG. 10 is in its ON-state, the following relationships are established:

$$(R_1 + R_2)I_1 - R_2 \cdot I_b = V \tag{18}$$
$$R_1 \cdot I_1 + R_3(1 + h_{fe})I_b = V - V_{BE} \tag{19}$$
$$I = I_1 + h_{fe} \cdot I_b \tag{20}$$

From equations (18) and (19), $I_1$ and $I_b$ can be obtained as follows:

$$I_1 = \frac{R_3(1 + h_{fe})V + R_2(V - V_{BE})}{(R_1 + R_2)R_3(1 + h_{fe}) + R_1 \cdot R_2} \tag{21}$$

$$I_b = \frac{(R_1 + R_2)(V - V_{BE}) - R_1 \cdot V}{(R_1 + R_2)R_3(1 + h_{fe}) + R_1 \cdot R_2} \tag{22}$$

If equations (21) and (22) are substituted into equation (20), the following is derived.

$$I = \frac{R_3(1 + h_{fe})V + R_2(V - V_{BE})}{(R_1 + R_2)R_3(1 + h_{fe}) + R_1 \cdot R_2} +$$
$$\frac{h_{fe}(R_1 + R_2)(V - V_{BE}) - h_{fe} \cdot R_1 \cdot V}{(R_1 + R_2)R_3(1 + h_{fe}) + R_1 \cdot R_2} \tag{23}$$

Equation (23) can be rearranged as follows:

$$I = \frac{(R_2 + R_3)(1 + h_{fe})}{(R_1 + R_2)R_3(1 + h_{fe}) + R_1 \cdot R_2} V -$$
$$\frac{R_1 \cdot h_{fe} + R_2(1 + h_{fe})}{(R_1 + R_2)R_3(1 + h_{fe}) + R_1 \cdot R_2} V_{BE} \tag{24}$$

A valid assumption in equation (24) is that $1 + h_{fe}$ is approximately $h_{fe}$ and that $(R_1 + R_2)R_3(1 + h_{fe}) \gg R_1 \cdot R_2$. With this assumption, equation (24) can be expressed as follows:

$$I = \frac{R_2 + R_3}{(R_1 + R_2)R_3} V - \frac{V_{BE}}{R_3} \tag{25}$$

If, in equation (25), the terms are consolidated such that $$\frac{R_2 + R_3}{(R_1 + R_2)R_3} \equiv A \tag{26}$$

and $$\frac{V_{BE}}{R_3} \equiv B, \tag{27}$$

then this equation can be expressed as follows:

$$I = A \cdot V - B \tag{28}$$

Figure 11:
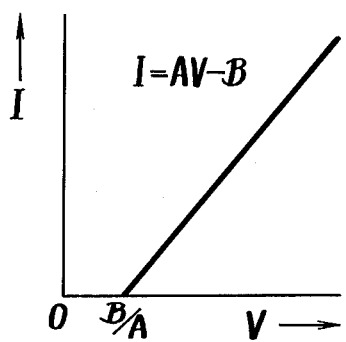
FIGS. 11 and 12 are graphs depicting the impedance characteristics of the circuit shown by way of example in FIG. 8.

In equation (28) the current I is positive and can be graphically depicted as shown in FIG. 11.

The impedance (resistance in this embodiment) Z between the first and second terminals $T_1$ and $T_2$ can be expressed from equation (28) as follows:

$$Z = \frac{V}{I} = \frac{V}{A \cdot V - B} = \frac{1}{A - \frac{B}{V}} \tag{29}$$

Figure 12:
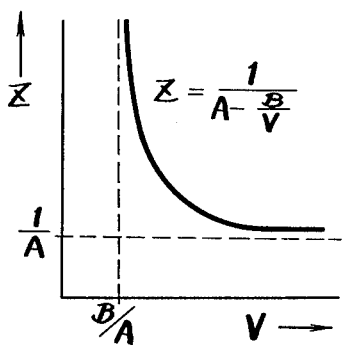

In equation (29) the impedance is positive and can be graphically depicted as shown in FIG. 12. This graphical representation is a hyperbolic curve with the values $V = B/A$ and $Z = 1/A$ being asymtotes, respectively.

While this hyperbolic relation between the impedance Z and the voltage V can be maintained, the value of the impedance can be changed to account for different FET's having different amplification constants $\mu$ and different pinch-off voltages $V_P$ (which, nevertheless, are related by the expression $\mu V_P =$ constant) by suitably varying one or more of the respective resistances $R_1$, $R_2$ and $R_3$ of first, second and third resistors 1, 2 and 3.

By way of a numerical example, if $R_1 = 2K\Omega$, $R_2 = 200\Omega$, $R_3 = 20\Omega$ and $V_{BE} = 0.6$ volts then $B/A = 6$ volts and $1/A = 200\Omega$, respectively.

In the embodiment shown in FIG. 7, the resistor 2 is made variable to account for differences in the $\mu$ and $V_P$ of the particular FET's $Q_{3a}$ and $Q_{3b}$ which are used in the circuit, to make the DC drain bias current of the FET's $Q_{3a}$ and $Q_{3b}$ substantially constant regardless of fluctuation in the voltage supplied by the voltage source.

With the circuit described above, the DC drain bias current of the FET's (which are not pinched off by the voltages applied thereto) can be held constant by the bias circuit irrespective of fluctuations in the voltage produced by the source of operating voltage, and this bias circuit can be adjusted to account for the particular pinch-off voltage $V_P$ and the voltage amplification constant $\mu$ of the FET's which are actually used without changing the impedance presented to the information signal. Accordingly, when this circuit is used in a push-pull amplifier, cross-over distortion can be avoided.

The above description has been presented for the embodiment wherein the FET's are connected in pure complementary class-AB push-pull amplifier configuration. It is, of course, apparent that the present invention can be used in a class-A amplifier circuit. The foregoing, as well as various other changes and modifications in form and details, including the changes described hereinabove, can be made without departing from the spirit and scope of the invention. It is intended that the appended claims be interpreted as including all such changes and modifications.

What is claimed is:

1. A bias circuit for use with a field effect transistor comprising: means for supplying an operating voltage susceptible to voltage fluctuations; a field effect transistor having triode-type dynamic characteristics and including gate, source and drain electrodes; means for applying said operating voltage across said drain and source electrodes through a load; input circuit means for applying an input signal to said gate electrode; bias voltage generating means for generating a bias voltage and applying same to said gate electrode of said field effect transistor, said bias voltage generating means including compensating means coupled to said operating voltage supply means and responsive to voltage fluctuations in said operating voltage to correspondingly vary said bias voltage applied to said gate electrode so as to stabilize the DC drain bias current of said field effect transistor in spite of the voltage fluctuations in the operating voltage; and voltage-controlled impedance means having a pair of terminals at least one of which being coupled to said compensating means and supplied with said operating voltage, said impedance means including biased semiconductor means connected to said pair of terminals having an impedance thereacross which varies with said operating voltage fluctuations in a hyperbolic relation that is substantially the same as the relationship between the amplification constant ($\mu$) and the pinch off voltage ($Vp$) characteristics of said field effect transistor so as to adjust the DC gate bias voltage applied to said field effect transistor even though the pinch-off voltage ($Vp$) and the amplification constant ($\mu$) may deviate from one field effect transistor to another.

2. A bias circuit in accordance with claim 1 wherein said variable impedance means comprises first and second resistors connected in series between said pair of terminals; a transistor whose base electrode is connected to the junction defined by said first and second resistors and whose collector-emitter circuit is connected between said pair of terminals; and a third resistor connected in the emitter circuit of said transistor.

3. A bias circuit in accordance with claim 2 wherein said first resistor has a resistance value $R_1$, said second resistor has a resistance value $R_2$, said third resistor has a resistance value $R_3$ and said transistor has a base-emitter potential $V_{BE}$, and wherein the impedance Z of said variable impedance means between said pair of terminals varies with a voltage V across said terminals as $$Z = \frac{1}{A - \frac{B}{V}}$$

where $$A = \frac{R_2 + R_3}{(R_1 + R_2)R_3}$$

and $$B = \frac{V_{BE}}{R_3},$$

and said voltage V varies as said operating voltage varies.

4. A bias circuit in accordance with claim 3 wherein one of said first, second and third resistors is adjustable to vary the value of said impedance Z while maintaning the hyperbolic relationship between said impedance Z and said voltage V.

5. A bias circuit in accordance with claim 3 wherein said bias voltage generating means comprises a bias transistor having one of its collector and emitter electrodes coupled to said operating voltage supply means and the other of its collector and emitter electrodes coupled to a fourth resistor, the base electrode of said bias transistor being coupled to one of said pair of terminals of said variable impedance means; and constant voltage means coupled to said operating voltage supply means to produce and apply a constant voltage to said base electrode of said bias transistor; whereby the voltage across said fourth resistor is said bias voltage.

6. A bias circuit in accordance with claim 5 wherein said constant voltage means comprises diode means poled in the same direction as the emitter-base junction of said bias transistor.

7. A bias circuit in accordance with claim 5 wherein said input circuit means comprises a signal input terminal for receiving a signal to be amplified; and means for connecting said signal input terminal to said fourth resistor such that said signal is superimposed onto said bias voltage through said fourth resistor and supplied to the gate electrode of said field effect transistor.

8. A bias circuit in accordance with claim 7 wherein said bias voltage generating means further comprises an additional transistor coupled to said fourth resistor for supplying said bias voltage and said superimposed signal to said field effect transistor.

9. A bias circuit in accordance with claim 5 wherein said bias voltage generating means further comprises a second bias transistor having one of its collector and emitter electrodes coupled to a second source of operating voltage and the other of its collector and emitter electrodes coupled to a fifth resistor, the base electrode of said second bias transistor being coupled to the other of said pair of terminals of said variable impedance means; and second constant voltage means coupled to said second source of operating voltage to produce and apply a second constant voltage to said base electrode of said second bias transistor; whereby a second bias voltage is produced across said fifth resistor and is adapted to be applied to a complementary field effect transistor.

10. A bias circuit for use with a complementary push-pull amplifier, said amplifier including first and second field effect transistors connected in complementary push-pull configuration, each field effect transistor having triode-type dynamic characteristics, comprising means for supplying operating voltages susceptible to voltage fluctuations; means for applying said operating voltages across respective drain and source electrodes through a load; input circuit means for applying an input signal to the gate electrodes of said first and second field effect transistors; a first bias voltage generating means for generating a bias voltage and applying same to said gate electrode of said first field effect transistor; and a second bias voltage generating means for generating a bias voltage and applying same to said gate electrode of said second field effect transistor; said first and second bias voltage generating means being coupled to compensating means, the latter being coupled to said operating voltage supply means for varying the respective bias voltages applied to said gate electrodes in response to voltage fluctuations in said operating voltages so as to stabilize the respective DC drain bias currents of said first and second field effect transistors in spite of the voltge fluctuations in the operating voltages, said compensating means including variable impedance means having an impedance which varies with said operating voltage fluctuations in a hyperbolic relation that is substantially the same as the relationship between the amplification constant ($\mu$) and the inch off voltage ($Vp$) characteristics of said first and second field effect transistors so as to adjust the DC gate bias voltages of said first and second field effect transistors even though the pinch off voltage ($Vp$) and the amplification constant ($\mu$) may deviate from one set of complementary field effect transistors to another.

11. A bias circuit in accordance with claim 10 wherein each of said first and second bias voltage generating means comprises a respective bias transistor having its emitter electrode coupled to a respective terminal of said operating voltage supply means and its collector electrode coupled through a resistor to the collector electrode of the other bias transistor; and constant voltage means coupled to said respective terminal of said operating voltage supply means to produce and apply a constant voltage to the base electoode of said bias transistor; and wherein said variable impedance means is connected between the base electrodes of said respective bias transistors.

12. A bias circuit in accordance with claim 11 wherein said variable impedance means comprises a pair of terminals coupled to said base electrodes of said bias transistors; a pair of resistors connected in series between said pair of terminals having resistances $R_1$ and $R_2$, respectively; a transistor having its base electrode connected to the junction defined by said pair of resistors and having its collector-emitter circuit in series between said pair of terminals; and an emitter resistor having resistance $R_3$ connected in the emitter circuit of said transistor; wherein the impedance Z between said pair of terminals varies with the voltage V applied to the base electrode of a bias transistor in accordance with the relation $$Z = \frac{1}{A - \frac{B}{V}}$$

where $$A = \frac{R_2 + R_3}{(R_1 + R_2)R_3}, B = \frac{V_{BE}}{R_3}$$

and $V_{BE}$ is the base-emitter potential of said transistor.

* * * * *